United States Patent
Jun

(10) Patent No.: US 6,171,967 B1
(45) Date of Patent: Jan. 9, 2001

(54) METHOD FOR FORMING A SELF-ALIGNED METAL WIRE OF A SEMICONDUCTOR DEVICE

(75) Inventor: Young-Kwon Jun, Seoul (KR)

(73) Assignee: LG Semicon Co., Ltd., Choongcheongbuk-do (KR)

(*) Notice: Under 35 U.S.C. 154(b), the term of this patent shall be extended for 0 days.

(21) Appl. No.: 08/893,582

(22) Filed: Jul. 11, 1997

(30) Foreign Application Priority Data

Jul. 13, 1996 (KR) .................................................. 96-28408

(51) Int. Cl.[7] .................................................. H01L 21/311
(52) U.S. Cl. .......................... 438/700; 438/712; 438/717; 438/736
(58) Field of Search ..................................... 438/734, 700, 438/702, 706, 736, 717, 723, 724, 712

(56) References Cited

U.S. PATENT DOCUMENTS

| | | |
|---|---|---|
| 4,758,305 | * 7/1988 | Bonifield et al. . |
| 4,985,374 | * 1/1991 | Tsuji et al. . |
| 5,157,003 | * 10/1992 | Tsuji et al. . |
| 5,240,554 | * 8/1993 | Hori et al. . |
| 5,525,192 | * 6/1996 | Lee et al. . |
| 5,681,780 | * 10/1997 | Mihara et al. . |

OTHER PUBLICATIONS

Kaanta, et al., "Dual Damascene: A ULSI Wiring Technology," IEEE (1991) pp. 144–152.

* cited by examiner

Primary Examiner—Benjamin Utech
Assistant Examiner—Duy-Vu Deo

(57) ABSTRACT

A metal wire forming method for a semiconductor device includes the step of forming a first insulator film over a substrate having at least a second insulator film formed thereon and a first conductive layer formed on the second insulator film. Next, a photosensitive film is formed on the first insulator film, and the photosensitive film is exposed and developed according to a contact hole pattern. This exposes a portion of the first insulator film, and the exposed portion is then etched using the photosensitive film as a mask to form a contact hole in the first insulator film. The method further includes the steps of exposing and developing the photosensitive film according to a trench pattern which includes the contact hole pattern, and etching the first insulator film using the photosensitive film as the mask so that a trench having a predetermined depth is formed in the first insulator film and the first conductive layer is exposed via the contact hole. Next, the photosensitive film is removed, and the trench and the contact hole are filled with a conductive material to form a second conductive layer electrically connected to the first conductive layer.

17 Claims, 11 Drawing Sheets

METHOD FOR FORMING A SELF-ALIGNED METAL WIRE OF A SEMICONDUCTOR DEVICE

BACKGROUND OF THE INVENTION

1. Field of the Invention

The present invention relates to a method for forming a self-aligned metal wire of a semiconductor device, and more particularly to a method for forming a self-aligned metal wire of a semiconductor device which prevents the surface of a contact hole from being reduced due to an erroneous alignment of a trench for forming the contact hole and upper layer wiring.

2. Discussion of Related Art

In general, aluminum or aluminum alloy film has high electrical conductivity, excellent adhesion to silicon oxide film, is easily patterned through dry etching, and also has a relatively low cost. Such films have been widely used as the circuit metal wiring in a semiconductor device. However, since the metal wiring becomes fine and multilayered as the size of the semiconductor device is reduced to increase the density thereof, the topography of a surface where the metal wiring is to be formed deteriorates. Alternatively, stepcoverage at an angle or bent portion, such as the inside of a contact hole, becomes emphasized. That is, when forming the metal wiring film by sputtering aluminum or aluminum alloy film through a conventional method, the thickness of the metal wiring film becomes particularly thin at the angle portion due to the shadow effect. More particularly, this phenomenon seriously occurs in contact holes with an aspect ratio larger than one.

Accordingly, instead of a physical deposition method such as sputtering, studies have been performed to improve stepcoverage by using the chemical vapor deposition method (CVD) which is capable of flattening a surface of the film to be formed.

As the width of the metal wiring becomes very fine with the increased density of the semiconductor device, the metal wiring has to be formed with a metal having a higher electrical conductivity than aluminum or aluminum alloy such as copper (Cu), gold (Au) and silver (Ag). Since copper has excellent electro-migration and stress migration characteristics as well as lower resistivity as compared with aluminum, metal wiring formed with copper has enhanced reliability. Thus, a method of forming metal wiring film of copper by sputtering or by CVD has been studied.

However, when etching copper using a halogen chemical compound, usually used to etch aluminum, the temperature has to be increased to a high temperature of about 500° C. because the vapor pressure of halogen chemical compounds is low.

Accordingly, a method of directly patterning the copper wiring through etching is not used. Instead, a method of making a buried conductor by performing an etchback through chemical mechanical polishing (CMP), after (1) forming a trench structure corresponding to the desired metal wiring pattern on the substrate and (2) depositing copper thin film, is being studied. Furthermore, techniques of multi-wiring by (1) aligning (a) the contact hole for connecting lower wiring and upper wiring and (b) the trench for forming the upper wiring, and (2) connecting the lower wiring and the upper wiring through the contact hole upon formation of upper wiring have been published in VMIC (p.144–p152) by IBM Inc., on 1991, entitled "Dual Damascene: A ULSI Wiring Technology", and in an IEDM (p.305–p308) by NEC Inc., entitled "A Quarter-Micron Planarized Interconnection Technology With Self-Aligned Plug".

FIGS. 1A to 1D are provided for explaining a method of forming a self-aligned metal wire of a semiconductor device in accordance with the above-cited technique published by IBM Inc.

Referring to FIG. 1A, a first insulator film 13 is formed on a semiconductor substrate 11, and a first conductive layer 15 is formed on the first insulator film 13. Then, the first conductive layer 15 is longitudinally pattered through a conventional photolithography method, and a second insulator film 17 is formed on the first insulator film 13 and the first conductive layer 15. Next, a first photosensitive film 19 is deposited on the second insulator film 17, and then exposed and developed to expose the second insulator film 17 where a contact hole is to be formed. A second photosensitive film 21 is deposited on the exposed part of the second insulator film 17 and the first photosensitive film 19, and is longitudinally exposed and developed in a length direction of the first conductive layer 15. At this time, a developed part of the second photosensitive film 21, i.e., a trench pattern for forming an upper conductive layer, includes part of the exposed second insulator film 17 and an undeveloped portion of the first photosensitive film 19.

In FIG. 1B, the exposed part of the second insulator film 17 is anisotrophy-etched to a given depth using the first and second photosensitive films 19 and 21 as a mask to form the contact hole 23. The contact hole 23 is formed so that the first conductive layer 15 is not exposed.

As shown in FIG. 1C, the second and the first photosensitive films 21 and 19 are sequentially etchbacked to transfer the trench pattern of the second photosensitive film 21 to the first photosensitive film 19. Then, the exposed part of the first photosensitive film 19 is removed so that the second insulator film 17 may be exposed. Accordingly, the second insulator film 17 is longitudinally exposed in a length direction of the first conductive layer 15. The second insulator film 17 is anisotrophy-etched with the second and first photosensitive films 21 and 19 as the mask to form the trench 25. At this time, a bottom surface of the contact hole 23 is etched so that the first conductive layer 15 is exposed by the contact hole 23.

Regarding FIG. 1D, after the first and the second photosensitive films 19 and 21 are removed, conductive material such as copper etc., with which the contact hole 23 and the trench 25 are filled, is deposited on the second insulator film 17 so as to be electrically connected to the first conductive layer 15 and to form a second conductive layer 27. The second conductive layer 27 deposited on the second insulator film 17 is then etchbacked through the chemical mechanical polishing CMP method.

FIGS. 2A to 2D are provided for explaining a method of forming a self-aligned metal wire of a semiconductor device in accordance with the conventional technique described by NEC Inc.

Referring to FIG. 2A, the first insulator film 13 is formed on the semiconductor substrate 11, and the first conductive layer 15 is formed on the first insulator film 13. The first conductive layer 15 is longitudinally patterned by the conventional photolithography method, and the second insulator film 17 is formed on the first insulator film 13 and the first conductive layer 15.

In FIG. 2B, another insulating material whose etching select ratio is different from that of the first insulator film 13 is deposited on the second insulator film 17 to form an etching protection layer 18. The first photosensitive film 19 is deposited on the etching protection layer 18, and then exposed and developed to expose the etching protection layer 18 where the contact hole is to be formed. Further, the second insulator film 17 is exposed by etching the exposed part of the etching protection layer 18 using the first photosensitive film 19 as a mask.

As to FIG. 2C, the first photosensitive film 19 is removed and then, a third insulator film 20 is formed on the second insulator film 17 and the etching protection layer 18 using the same insulating material as the second insulator film 17. The second photosensitive film 21 is deposited on the third insulator film 20 and is longitudinally exposed and developed in a length direction of the first conductive layer 15. At this time, the developed part of the second photosensitive film 21, which has the trench pattern for forming the upper conductive layer, includes the exposed part of the second insulator film 17 and exposes a portion of the third insulator film 20. The exposed part of the third insulator film 20 is etched using the second photosensitive film 21 as the mask so that the etching protection layer 18 is exposed; thereby forming the trench 25. Sequentially, the second insulator film 17 is etched using the etching protection layer 18 as a mask so that the first conductive layer 15 is exposed; thereby forming the contact hole 23.

Regarding FIG. 2D, after the second photosensitive film 21 is removed, conductive material such as copper, etc., with which the contact hole 23 and the trench 25 are filled, is deposited on the third insulator film 20 so as to be connected with the first conductive layer 15 and to form the second conductive layer 27. The second conductive layer 27 deposited on the third insulator film 20 is etchbacked by the CMP method, etc.

In the conventional metal wiring forming methods, since the first photosensitive film for forming the contact hole and the second photosensitive film for forming the trench are respectively exposed using different masks, there are some disadvantages in that the manufacturing process is very complicated and the contact surface area is reduced due to erroneous mask alignment; thereby increasing contact resistance.

SUMMARY OF THE INVENTION

Accordingly, the present invention is directed to a method for forming a self-aligned metal wire that substantially obviates one or more of the problems due to limitations and disadvantages of the related art.

An object of the present invention is to provide a method for forming a self-aligned metal wire of a semiconductor device capable of enhancing contact resistance and density by preventing erroneous alignment of a contact hole and a trench.

Another object of the present invention is to provide a method for forming a self-aligned metal wire of a semiconductor device capable of simplifying the manufacturing process of depositing a photosensitive film.

It is to be understood that both the foregoing general description and the following detailed description are exemplary and explanatory and are intended to provide further explanation of the invention as claimed.

These and other objects are achieved by providing a metal wire forming method for a semiconductor device comprising the steps of: (a) forming a first insulator film over a substrate having at least a second insulator film formed thereon and a first conductive layer formed on said second insulator film; (b) forming a photosensitive film on said first insulator film; (c) exposing and developing said photosensitive film according to a contact hole pattern to expose a portion of said first insulator film; (d) etching said exposed portion of said first insulator film using said photosensitive film as a mask to form a contact hole in said first insulator film; (e) exposing and developing said photosensitive film according to a trench pattern which includes said contact hole; (f) etching said first insulator film using said photosensitive film as the mask so that a trench having a predetermined depth is formed in said first insulator film and said first conductive layer is exposed via said contact hole; (g) removing said photosensitive film; and (h) filling said trench and said contact hole with a conductive material to form a second conductive layer electrically connected to said first conductive layer.

These and other objects are also achieved by providing a metal wire forming method for a semiconductor device comprising the steps of: (a) forming a first insulator film over a substrate having at least a second insulator film formed thereon and a first conductive layer formed on said second insulator film; (b) depositing a photosensitive film on said first insulator film; (c) forming a contact hole and a trench in said photosensitive film according to a contact hole pattern and a trench pattern, respectively, said contact hole exposing said first insulator layer, said trench being formed to a predetermined depth in said photosensitive film and including said contact hole; (d) forming said contact hole in said first insulator film using said photosensitive film as a mask; (e) etching back said photosensitive film so that said trench is transferred to said first insulator film and said first conductive layer is exposed by said contact hole; (f) removing said photosensitive film; and (g) filling said trench and said contact hole with a conductive material to form a second conductive layer electrically connected to said first conductive layer.

Furthermore, these and other objects are achieved by providing a metal wire forming method for a semiconductor device comprising the steps of: (a) forming a first insulator film over a substrate having at least a second insulator film formed thereon and a first conductive layer formed on said second insulator film; (b) depositing a photosensitive film on said first insulator film; (c) exposing said photosensitive film according to a contact hole pattern to form an exposed and unexposed portion of said photosensitive film; (d) doping said photosensitive film with impurity to form an transmutation layer having a predetermined depth in said unexposed portion of said photosensitive film; (e) developing said exposed portion of said photosensitive film to form a contact hole in said photosensitive film; (f) etching to form said contact hole in said first insulator film using said photosensitive film as a mask; (g) exposing and developing said unexposed portion of said photosensitive film according to a trench pattern to form a trench in said photosensitive film having a first predetermined depth, said trench including said contact hole; (h) etching back said photosensitive film so that said trench is transferred to said first insulator film and said first conductive layer is exposed by said contact hole; (i) removing said photosensitive film; and (j) filling said trench and said contact hole with a conductive material to form a second conductive layer electrically connected to said first conductive layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1A:
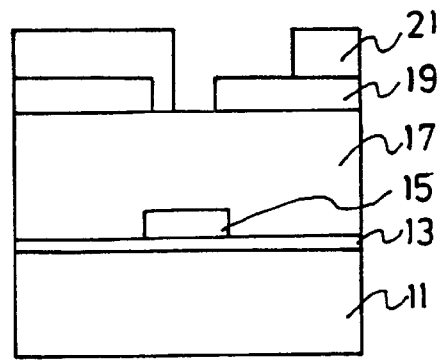
FIGS. 1A to 1D are views for explaining a conventional method for forming a self-aligned metal wire of a semiconductor device.
Figure 1B:
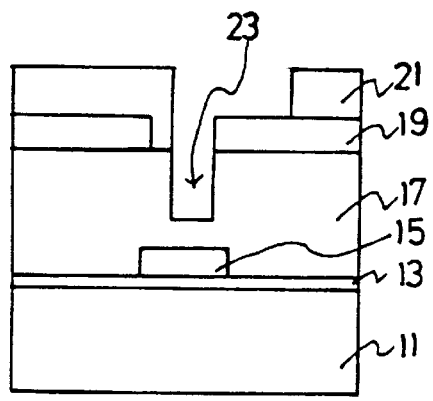
Figure 1C:
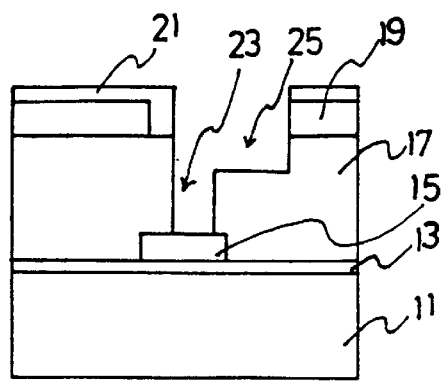
Figure 1D:
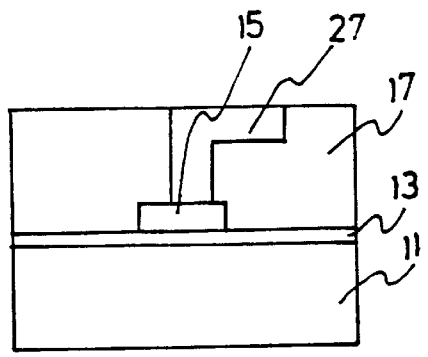
Figure 2A:
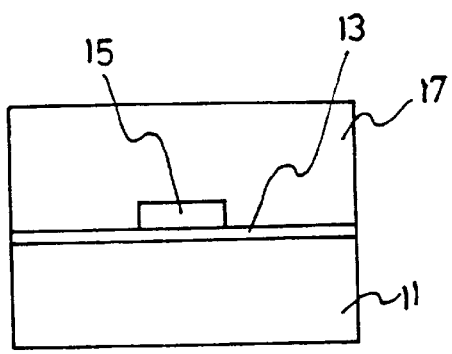
FIGS. 2A to 2D are views for explaining another conventional method for forming a selfaligned metal wire of a semiconductor device.
Figure 2B:
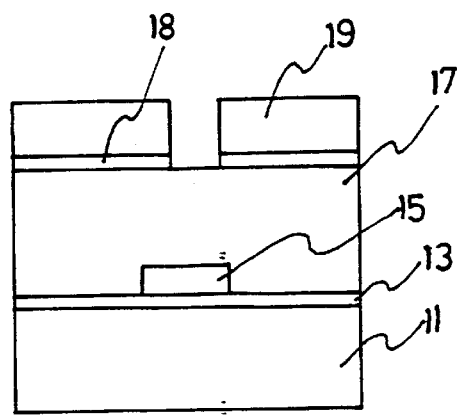
Figure 2C:
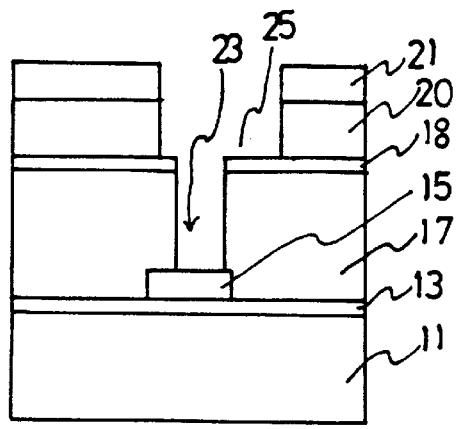
Figure 2D:
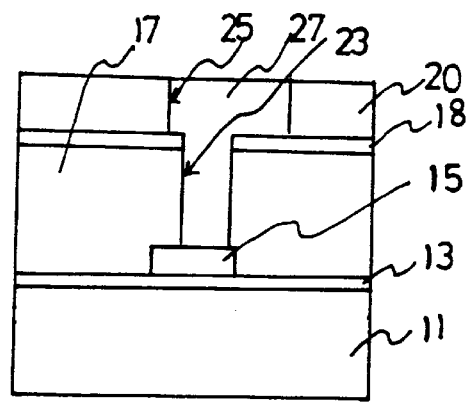
Figure 3A:
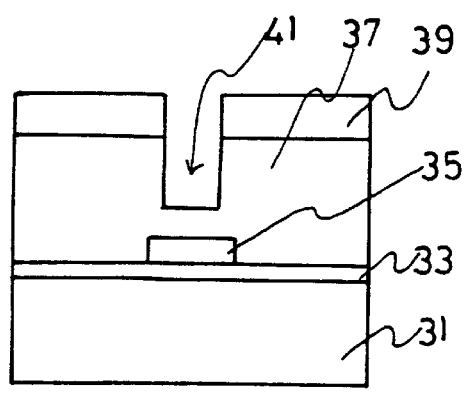
FIGS. 3A to 3C are views for explaining a method for forming a self-aligned metal wire of a semiconductor device in accordance with the first embodiment of the present invention.
Figure 3B:
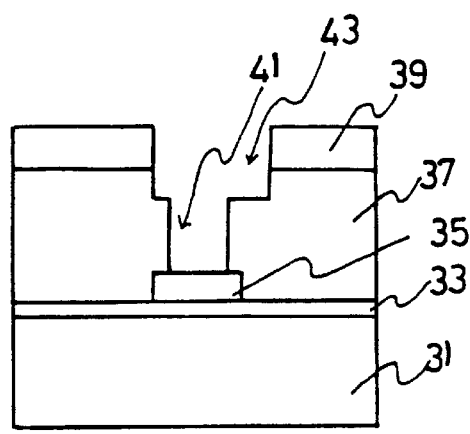
Figure 3C:
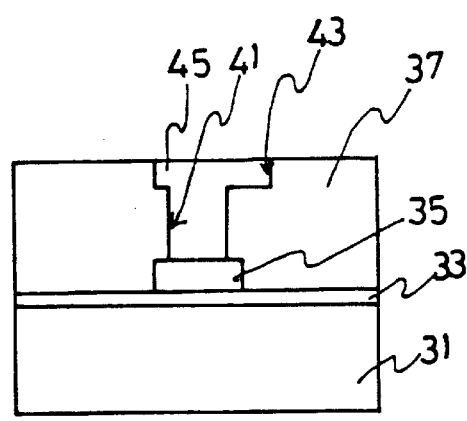

FIGS. 3A to 3C are provided for explaining a method for forming a self-aligned metal wire of a semiconductor device in accordance with the first embodiment of the present invention.

Referring to FIG. 3A, a first insulator film 33 is formed on a semiconductor substrate 31, and a first conductive layer 35 is formed on the first insulator film 33. An impurity diffusion area (not shown) or lead is formed on the semiconductor substrate 31, and the first conductive layer 35 is electrically connected to the impurity diffusion area or lead. The first conductive layer 35 is longitudinally patterned through a general photolithography method, and a second insulator film 37 is formed on the first insulator film 33 and the first conductive layer 35. Next, a positive type photosensitive film 39 is deposited on the second insulator film 37, and is first exposed and developed to form a contact hole pattern exposing the second insulator film 37. The exposed part of the second insulator film 37 is anisotrophy-etched to a given depth using the photosensitive film 39 as a mask and a reactive ion including fluorine such as $CF_4$ or $CHF_3$, etc., to form a contact hole 41. At this time, the first conductive layer 35 is not exposed by the contact hole 41.

Regarding FIG. 3B, the residual photosensitive film 39, (i.e., the photosensitive film 39 remaining after the first exposure and development process of FIG. 3A) is exposed and developed to form a trench pattern which includes the contact hole pattern and is longitudinally formed in a length direction of the first conductive layer 35. In the above, the residual photosensitive film 39 was not exposed during the exposure and development process of FIG. 3A; and accordingly, it is possible to expose and develop the residual photosensitive film 39.

In FIG. 3C, an exposed part of the second insulator film 37, exposed by the second exposing and developing of the photosensitive film 39, is anisotrophy-etched to a given depth with a reactive ion including fluorine such as $CF_4$ or $CHF_3$, etc., to form a trench 43. At this moment, the bottom surface of the contact hole 41 is also etched; and accordingly, the first conductive layer 35 is exposed by the contact hole 41. After the photosensitive film 39 is removed, a conductive material, which is preferably comprised of one of aluminum, copper, gold, silver, platinum or their alloy, is deposited on the entire surface through the sputtering or chemical vapor deposition method, etc., to form the second conductive layer 45. At this time, the second conductive layer 45 fills the contact hole 41 as well as the trench 43, and is electrically connected to the first conductive layer 35. The second conductive layer 45 deposited on the second insulator film 37 is etchbacked by the CMP method.

FIGS. 4A to 4D are provided for explaining the method for forming a self-aligned metal wire of a semiconductor device in accordance with the second embodiment of the present invention.

Figure 4A:
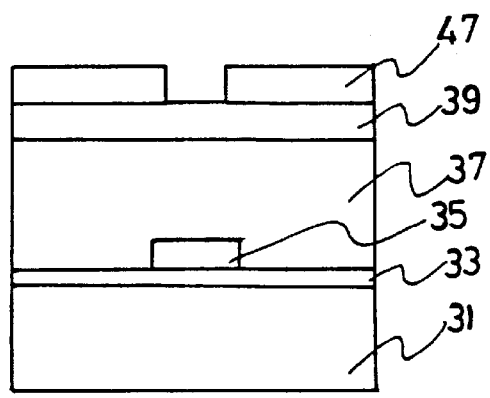
FIGS. 4A to 4D are views for explaining a method for forming a self-aligned metal wire of a semiconductor device in accordance with the second embodiment of the present invention.

Referring to FIG. 4A, the first insulator film 33 is formed on the semiconductor substrate 31, and the first conductive layer 35 is formed on the first insulator film 33. An impurity diffusion area (not shown) or the lead is formed on the semiconductor substrate 31, and the first conductive layer 35 is electrically connected to the impurity diffusion area or the lead. The first conductive layer 35 is longitudinally patterned by the general photolithography method, and the second insulator film 37 is formed on the first insulator film 33 and the first conductive layer 35. Next, the positive type photosensitive film 39 and a negative type photosensitive film 47 are sequentially deposited on the second insulator film 37. The upper negative type photosensitive film 47 is first exposed and developed to form the contact hole pattern; thereby exposing the lower positive type photosensitive film 39. In the above, the upper and lower photosensitive films 39 and 47 are respectively formed of positive type and negative type, but the photosensitive films 39 and 47 can be formed of the negative type and positive type, respectively.

Figure 4B:
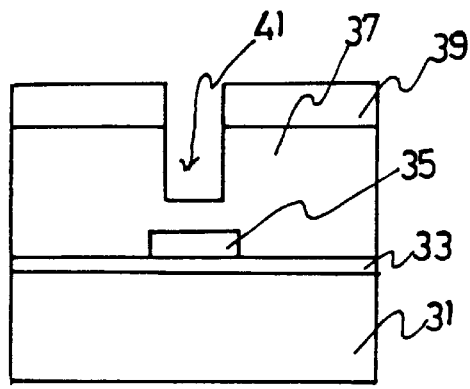

Regarding FIG. 4B, the upper and lower photosensitive films 47 and 39 are etchbacked using the anisotrophy etching method with a reactive ion which includes fluorine F such as $CF_4$ or $CHF_3$ etc., or oxygen O such as $O_2$ so that the upper photosensitive film 47 on the lower photosensitive film 39 is removed. At this time, the contact hole pattern formed on the upper photosensitive film 47 is transferred to the lower photosensitive film 39 exposing the second insulator film 37. The exposed part of the second insulator film 37 is anisotrophy-etched to a given depth using the lower photosensitive film 39 as the mask and a reactive ion including fluorine such as $CF_4$ or $CHF_3$ etc., to form the contact hole 41. At this time, the first conductive layer 35 is not exposed by the contact hole 41.

Figure 4C:
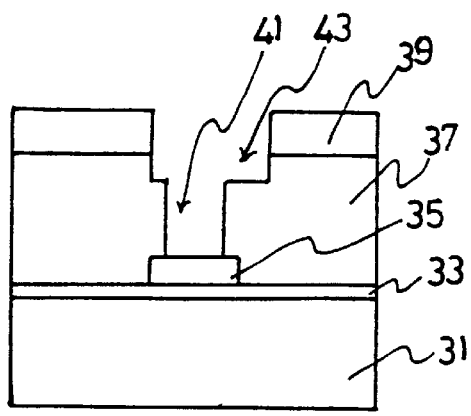

In FIG. 4C, the photosensitive film 39 where the contact hole pattern is formed is exposed and developed to form a trench pattern which includes the contact hole pattern and is longitudinally formed in a length direction of the first conductive layer 35. In the above, the photosensitive film 39 was not exposed during the exposing of the negative photosensitive film 47; and accordingly, it is possible to expose and develop the photosensitive film 39. The portion of the second insulator film 37 exposed by the second exposing and developing is anisotrophy-etched to a given depth with a reactive ion including fluorine like $CF_4$ or $CHF_3$ etc., to form the trench 43. The bottom surface of the contact hole 41 is also etched so that the first conductive layer 35 is exposed by the contact hole 41.

Figure 4D:
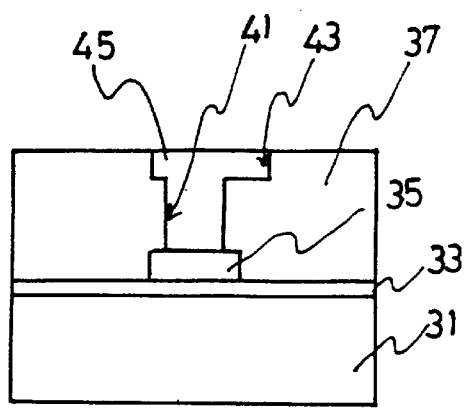

Regarding FIG. 4D, after the photosensitive film 39 is removed, a conductive material, which is preferably comprised of one of aluminum, copper, gold, silver, platinum or their alloy, is deposited on the entire surface through the sputtering or chemical vapor deposition method, etc., to form the second conductive layer 45. At this time, the second conductive layer 45 fills the contact hole 41 as well as the trench 43, and is electrically connected to the first conductive layer 35. Here, the second conductive layer 45 deposited on the second insulator film 37 is etchbacked by the CMP method.

FIGS. 5A to 5D are provided for explaining a method for forming a self-aligned metal wire of a semiconductor device in accordance with the third embodiment of the present invention.

Figure 5A:
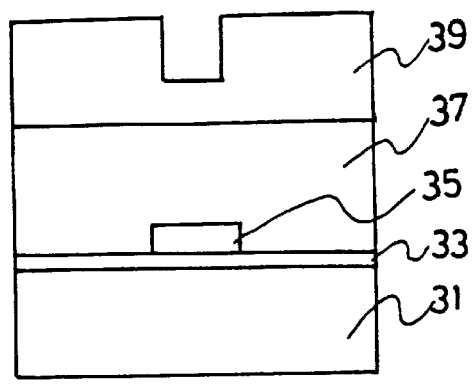
FIGS. 5A to 5D are views for explaining a method for forming a self-aligned metal wire of a semiconductor device in accordance with the third embodiment of the present invention.

Referring to FIG. 5A, a first insulator film 33 is formed on a semiconductor substrate 31, and a first conductive layer 35 is formed on the first insulator film 33. An impurity diffusion area (not shown) or lead is formed on the semiconductor substrate 31, and the first conductive layer 35 is electrically connected to the impurity diffusion area or lead. The first conductive layer 35 is longitudinally patterned through a general photolithography method and a second insulator film 37 is formed on the first insulator film 33 and the first conductive layer 35. Next, a positive type photosensitive film 39 is thickly deposited on the second insulator film 37. The photosensitive film 39 is first exposed and developed to a predetermined depth so that the second insulator film 37 is not exposed; thereby forming a contact hole pattern.

Figure 5B:
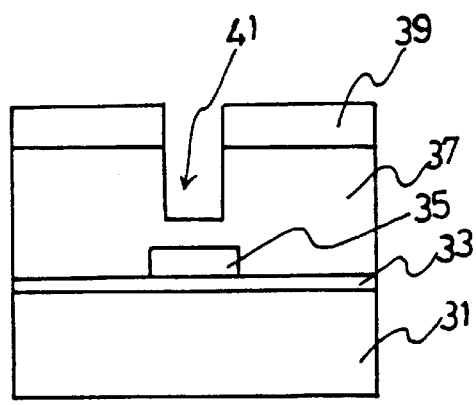

In FIG. 5B, the photosensitive film 39 is etchbacked using the anisotrophy etching method with a reactive ion which includes fluorine F such as $CF_4$ or $CHF_3$ etc., or oxygen O such as $O_2$, etc., so that the second insulator film 37 is exposed. In the above, the contact hole pattern formed in a predetermined part of the photosensitive film 39 is transferred from an upper portion to a lower portion of the photosensitive film 39 until the second insulator film 37 is exposed. The exposed part of the second insulator film 37 is then anisotrophy-etched to a predetermined depth using the residual photosensitive film 39 as the mask and with a reactive ion including fluorine such as $CF_4$ or $CHF_3$ etc., to form the contact hole 41. At this time, the first conductive layer 35 is not exposed by the contact hole 41.

Figure 5C:
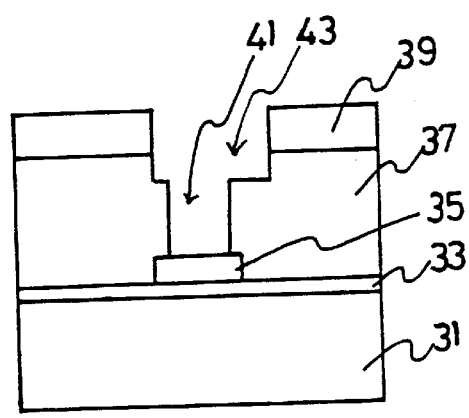

Regarding FIG. 5C, the photosensitive film 39 is exposed and developed a second time to form a trench pattern which includes the contact hole pattern and is longitudinally formed in a length direction of the first conductive layer 35. In the above, the residual photosensitive film 39 was not exposed during the first exposing; and accordingly, it is possible to expose and develop the residual photosensitive film 39. A portion of the second insulator film 37 exposed by the second exposing and developing of the photosensitive film 39 is anisotrophy-etched to a predetermined depth using a reactive ion including fluorine like $CF_4$ or $CHF_3$ etc., to form the trench 43. The bottom surface of the contact hole 41 is also etched; and accordingly, the first conductive layer 35 is exposed by the contact hole 41.

Figure 5D:
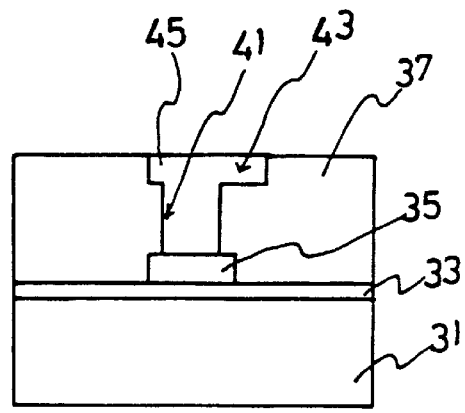

As to FIG. 5D, after the photosensitive film 39 is removed, a conductive material, which is preferably comprised of one of aluminum, copper, gold, silver, platinum or their alloy, is deposited on the entire surface having the aforesaid structure through the sputtering or chemical vapor deposition method, etc., to form the second conductive layer 45. At this time, the second conductive layer 45 fills in the contact hole 41 as well as the trench 43, and is electrically connected to the first conductive layer 35. Here, the second conductive layer 45 deposited on the second insulator film 37 is etchbacked by the CMP method.

FIGS. 6A to 6D are provided for explaining a method for forming a self-aligned metal wire of a semiconductor device in accordance with the fourth embodiment of the present invention.

Figure 6A:
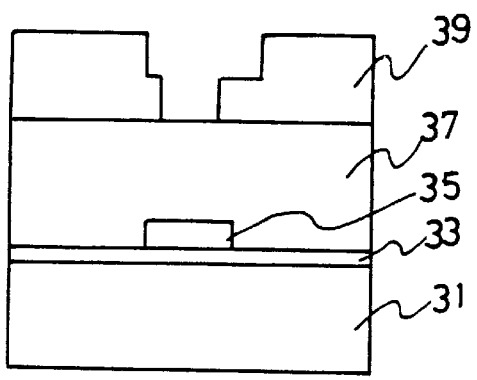
FIGS. 6A to 6D are views for explaining a method for forming a self-aligned metal wire of a semiconductor device in accordance with the fourth embodiment of the present invention.

Referring to FIG. 6A, a first insulator film 33 is formed on a semiconductor substrate 31, and a first conductive layer 35 is formed on the first insulator film 33. An impurity diffusion area (not shown) or lead is formed on the semiconductor substrate 31, and the first conductive layer 35 is electrically connected to the impurity diffusion area or lead. The first conductive layer 35 is longitudinally patterned through a general photolithography method, and a second insulator film 37 is formed on the first insulator film 33 and the first conductive layer 35. Next, a positive type photosensitive film 39 is thickly deposited on the second insulator film 37. The photosensitive film 39 is first exposed its entire thickness according to a contact hole pattern and is continuously second exposed to a predetermined depth according to a trench pattern which includes the aforesaid contact hole pattern. The first and second exposed portions are then developed to form the contact hole pattern and trench pattern as shown in FIG. 6A. The contact hole pattern exposes the second insulator film 37 over the first conductive layer 35, and the trench pattern is longitudinally formed in a length direction of the first conductive layer 35.

Figure 6B:
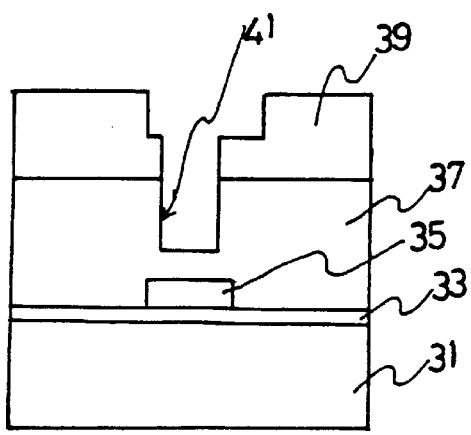

Regarding FIG. 6B, the exposed portion of the second insulator film 37 is anisotrophy-etched to a predetermined depth using the photosensitive film 39 as the mask and a reactive ion including fluorine F such as $CF_4$ or $CHF_3$ etc., to form the contact hole 41. At this time, the first conductive layer 35 is not exposed by the contact hole 41.

Figure 6C:
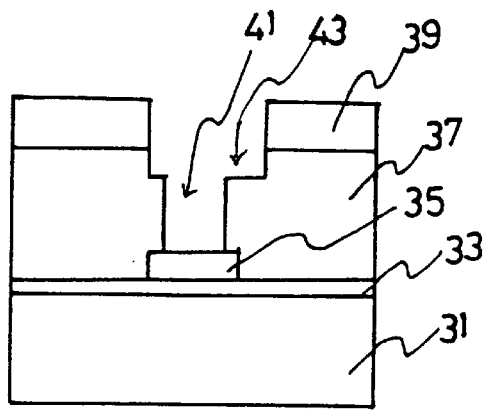

As to FIG. 6C, the photosensitive film 39 is etchbacked using the anisotrophy etching method with a reactive ion which includes fluorine F such as $CF_4$ or $CHF_3$ etc., or oxygen O such as $O_2$ so that the trench pattern can be transferred onto the second insulator film 37. The exposed portion of the second insulator film 37 is then anisotrophy-etched to a given depth with the residual photosensitive film 39 where the trench pattern is formed as the mask and with a reactive ion including fluorine such as $CF_4$ or $CHF_3$ etc., to form the trench 43. At this time, the contact hole 41 exposes the first conductive layer 35.

Figure 6D:
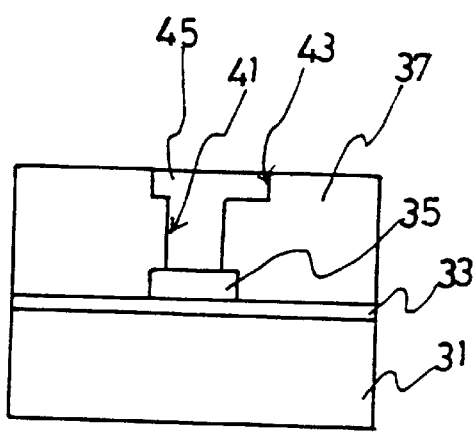

In FIG. 6D, after the photosensitive film 39 is removed, a conductive material, which is preferably comprised of one of aluminum, copper, gold, silver, platinum or their alloy, is deposited on the entire surface having the aforesaid structure through the sputtering or chemical vapor deposition method, etc., to form the second conductive layer 45. At this time, the second conductive layer 45 fills the contact hole 41 as well as the trench 43 and is electrically connected to the first conductive layer 35. Here, the second conductive layer 45 deposited on the second insulator film 37 is etchbacked by the CMP method.

FIGS. 7A to 7D are provided for explaining a method for forming a self-aligned metal wire of a semiconductor device in accordance with the fifth embodiment of the present invention.

Figure 7A:
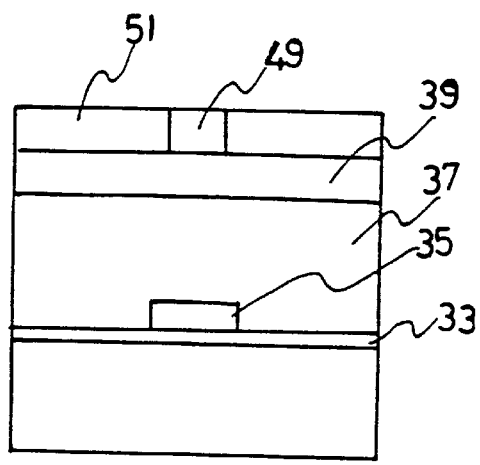
FIGS. 7A to 7D are views for explaining a method for forming a self-aligned metal wire of a semiconductor device in accordance with the fifth embodiment of the present invention.

Referring to FIG. 7A, a first insulator film 33 is formed on a semiconductor substrate 31, and a first conductive layer 35 is formed on the first insulator film 33. An impurity diffusion area (not shown) or lead is formed on the semiconductor substrate 31, and the first conductive layer 35 is electrically connected to the impurity diffusion area or lead. The first conductive layer 35 is longitudinally patterned through a general photolithography method and a second insulator film 37 is formed on the first insulator film 33 and the first conductive layer 35. Next, a positive type photosensitive film 39 is thickly deposited on the second insulator film 37. The photosensitive film 39 is first exposed to a predetermined depth to form an exposing area 49 according to a contact hole pattern. Next, the photosensitive film 39 is doped with organic material such as HMDS (Hexamethyldisilazane) including silicon (Si) or tin (Sn), etc., to form a transmutation layer 51 where the exposing area 49 is not formed.

Figure 7B:
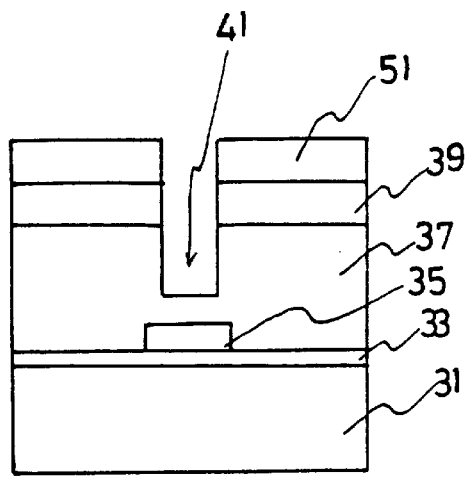

As to FIG. 7B, after the exposing area 49 is developed so as to be removed, the exposed part of the photosensitive film 39 is etched using the transmutation layer 51 as the mask and a reactive ion including fluorine such as $CF_4$ or $CHF_3$, etc., or oxygen like $O_2$, etc. Then, the contact hole pattern is transferred to the photosensitive film 39 and the second insulator film 37 is exposed. The exposed portion of the second insulator film 37 is anisotrophy-etched to a predetermined depth using the transmutation layer 51 as a mask and a reactive ion including fluorine such as $CF_4$ or $CHF_3$, etc., to form the contact hole 41. At this time, the first conductive layer 35 is not exposed by the contact hole 41.

Figure 7C:
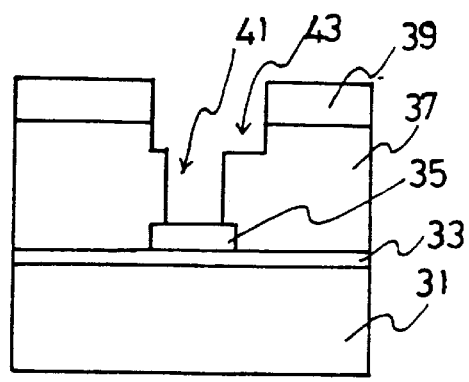

Regarding FIG. 7C, the photosensitive film 39, except for the transmutation layer 51, is exposed a second time according to a trench pattern which includes the contact hole pattern and is longitudinally formed in a length direction of the first conductive layer 35. Next, the transmutation layer 51 is selectively removed and the exposed part of the photosensitive film 39 is developed to form the trench pattern. Alternatively, after the transmutation layer 51 is selectively removed, it is possible to form the trench pattern by second exposing and developing the photosensitive film 39. The exposed portion of the second insulator film 37 is anisotrophy-etched using the photosensitive film 39 as a mask and a reactive ion including fluorine such as $CF_4$ or $CHF_3$, etc., to form the trench 43. At this time, the bottom surface of the contact hole 41 is etched; and accordingly, first conductive layer 35 is exposed by the contact hole 41.

Figure 7D:
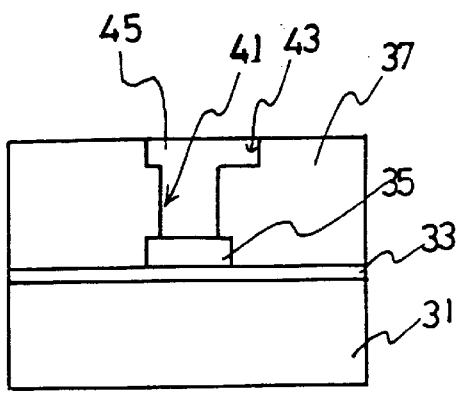

In FIG. 7D, after the photosensitive film 39 is removed, a conductive material, which is preferably comprised of one of aluminum, copper, gold, silver, platinum or their alloy, is deposited on the entire surface having the aforesaid structure through the sputtering or chemical vapor deposition method, etc., to form the second conductive layer 45. At this time, the second conductive layer 45 fills the contact hole 41 as well as the trench 43, and is electrically connected to the first conductive layer 35. Then, the second conductive layer 45 deposited on the second insulator film 37 is etchbacked by the CMP method.

FIGS. 8A to 8D are provided for explaining a method for forming a self-aligned metal wire of a semiconductor device in accordance with the sixth embodiment of the present invention.

Figure 8A:
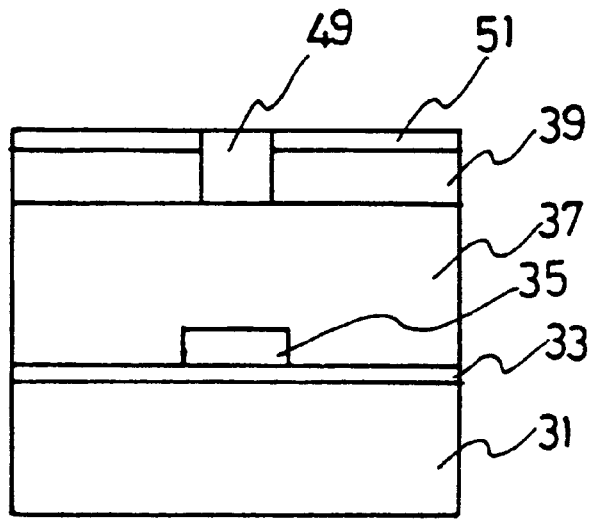
FIGS. 8A to 8D are views for explaining a method for forming a self-aligned metal wire of a semiconductor device in accordance with the sixth embodiment of the present invention.

Referring to FIG. 8A, a first insulator film 33 is formed on a semiconductor substrate 31, and a first conductive layer 35 is formed on the first insulator film 33. An impurity diffusion area (not shown) or lead is formed on the semiconductor substrate 31, and the first conductive layer 35 is electrically connected to the impurity diffusion area or lead. The first conductive layer 35 is longitudinally patterned through a general photolithography method, and a second insulator film 37 is formed on the first insulator film and the first conductive layer 35. Next, after a positive type photosensitive film 39 is deposited on the second insulator film 37, the photosensitive film 39 is first exposed its entire thickness according to a contact hole pattern; thereby forming the exposed area 49. After that, the unexposed portions of the photosensitive film 39 are doped with organic material such as HMDS (Hexamethyldisilazane) including silicon (Si) or tin (Sn), etc., to form a transmutation layer 51 having a predetermined depth.

Figure 8B:
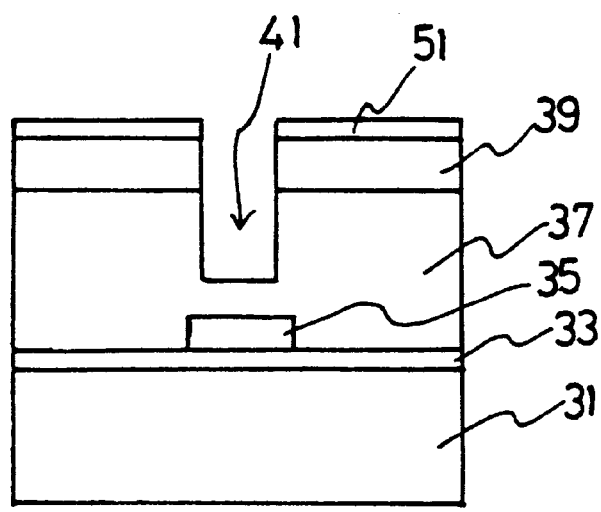

Regarding FIG. 8B, the exposing area 49 is developed to be removed so that the second insulator film 37 is exposed. The exposed portion of the second insulator film 37 is anisotrophy-etched using the transmutation layer 51 as a mask and a reactive ion including fluorine such as $CF_4$ or $CHF_3$, etc., to form the contact hole 41. At this time, the first conductive layer 35 is not exposed by the contact hole 41.

Figure 8C:
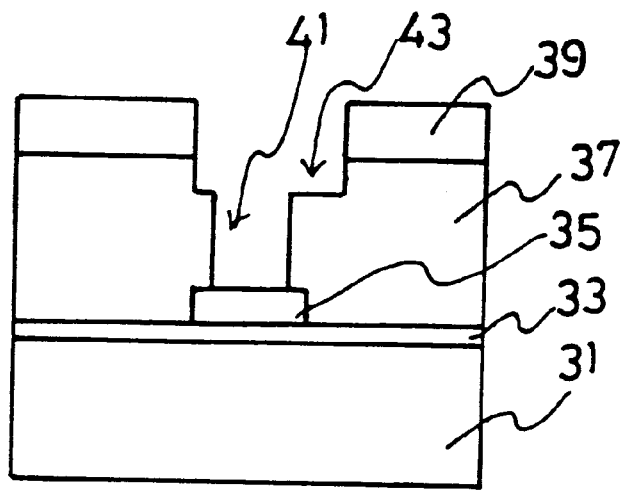

As to FIG. 8C, the photosensitive film 39, except for the transmutation layer 51, is second exposed according to a trench pattern which includes the contact hole pattern and is longitudinally formed in a length direction of the first conductive layer 35. Next, the transmutation layer 51 is selectively removed and the exposed portion of the photosensitive film 39 is developed to form the trench pattern. Alternatively, after the transmutation layer 51 is selectively removed, it is possible to form the trench pattern by second exposing and developing the photosensitive film 39. The exposed portion of the second insulator film 37 is anisotrophy-etched using the photosensitive film 39 as a mask and a reactive ion including fluorine such as $CF_4$ or $CHF_3$, etc., to form the trench 43. At this time, the bottom surface of the contact hole 41 is etched; and accordingly, the first conductive layer 35 is exposed by the contact hole 41.

Figure 8D:
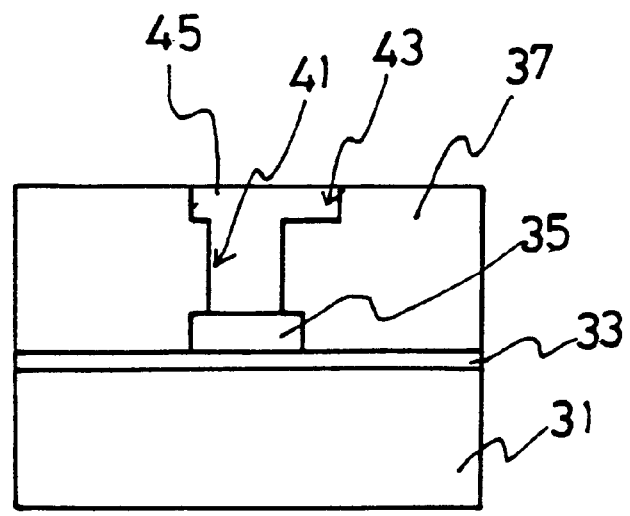

In FIG. 8D, after the residual photosensitive film 39 is removed, a conductive material, which is preferably comprised of one of aluminum, copper, gold, silver, platinum or their alloy, is deposited on the entire surface having the aforesaid structure through the sputtering or chemical vapor deposition method, etc., to form the second conductive layer 45. At this time, the second conductive layer 45 fills the contact hole 41 as well as the trench 43, and is electrically connected to the first conductive layer 35. Then, the second conductive layer 45 deposited on the second insulator film 37 is etchbacked by the CMP method.

Accordingly, the present invention has advantages in that the contact resistance density is enhanced by preventing the surface area of the contact hole from being reduced due to erroneous alignment of the contact hole and the trench. Also the manufacturing process is simplified by applying the photosensitive film as a monolayer and performing an exposing and developing step twice.

It will be apparent to those skilled in the art that various modifications and variations can be made in a magneto-matching metal wiring for a semiconductor device of the present invention without departing from the spirit or scope of the invention. Thus, it is intended that the present invention cover the modifications and variations of this invention.

What is claimed is:

1. A metal wire forming method for a semiconductor device comprising the steps of:
   (a) forming a first insulator film over a substrate having at least a second insulator film formed thereon and a first conductive layer formed on said second insulator film;
   (b1) forming a first photosensitive film of a first type on said first insulator film;
   (b2) forming a second photosensitive film of a second type on said first photosensitive film;
   (c1) exposing and developing said second photosensitive film according to a contact hole pattern to expose a portion of said first photosensitive film;
   (c2) etching said exposed portion of first photosensitive film to expose a portion of said first insulator film;
   (d) etching said exposed portion of said first insulator film using said first photosensitive film as a mask to form a contact hole in said first insulator film;
   (e) exposing and developing said first photosensitive film according to a trench pattern which includes said contact hole;
   (f) etching said first insulator film using said first photosensitive film as the mask so that a trench is formed in said first insulator film and said first conductive layer is exposed via said contact hole;
   (g) removing said first photosensitive film; and
   (h) filling said trench and said contact hole with a conductive material to form a second conductive layer electrically connected to said first conductive layer.

2. The method as claimed in claim 1, wherein a width of said contact hole is smaller than that of said trench.

3. The method as claimed in claim 1, wherein said first type is positive and said second type is negative.

4. The method as claimed in claim 1, wherein said first type is negative and said second type is positive.

5. The method as claimed in claim 1, wherein said step (d) etches said first insulator film using said photosensitive film as a mask such that said contact hole is formed in said first insulator film without exposing said first conductive layer.

6. The method as claimed in claim 1, wherein said conductive material is comprised of one of aluminum, copper, gold, silver, platinum or their alloy.

7. The method of claim 1, wherein step (h) comprises:
   (h1) depositing said conductive material on said first insulator film such that said trench and said contact hole are filled; and
   (h2) etching back said conductive material.

8. The method of claim 7, wherein said step (h2) is performed using a chemical mechanical polishing method.

9. The method as claimed in claim 1, wherein step (e) comprises:
   exposing and developing said second photosensitive film according to a trench pattern above said contact hole to expose a portion of said first photosensitive film;
   developing said exposed portion of said first photosensitive film; and
   removing said second photosensitive film.

10. The method as claimed in claim 1, wherein step (e) comprises:
    removing said second photosensitive film to expose said first photosensitive film;
    developing said first photosensitive film according to a trench pattern above said contact hole.

11. A metal wire forming method for a semiconductor device comprising the steps of:
    (a) forming a first insulator film over a substrate having at least a second insulator film formed thereon and a first conductive layer formed on said second insulator film;
    (b) forming a photosensitive film on said first insulator film;
    (c) exposing and developing said photosensitive film according to a contact hole pattern without exposing said first insulator film;
    (d) etching said photosensitive film to expose a portion of said first insulator film;
    (e) etching said exposed portion of said first insulator film using said photosensitive film as a mask to form a contact hole in said first insulator film;
    (f) exposing and developing said photosensitive film according to a trench pattern which includes said contact hole;
    (g) etching said first insulator film using said photosensitive film as the mask so that a trench is formed in said first insulator film and said first conductive layer is exposed via said contact hole;
    (h) removing said photosensitive film; and
    (i) filling said trench and said contact hole with a conductive material to form a second conductive layer electrically connected to said first conductive layer.

12. The method as claimed in claim 11, wherein said photosensitive film is a positive type.

13. The method as claimed in claim 11, wherein a width of said contact hole is smaller than that of said trench.

14. The method as claimed in claim 11, wherein said step (f) etches said first insulator film using said photosensitive film as a mask such that said contact hole is formed in said first insulator film without exposing said first conductive layer.

15. The method as claimed in claim 11, wherein said conductive material is comprised of one of aluminum, copper, gold, silver, platinum or their alloy.

16. The method of claim 11, wherein said step (h) comprises:
    (h1) depositing said conductive material on said first insulator film such that said trench and said contact hole are filled; and
    (h2) etching back said conductive material.

17. The method of claim 11, wherein said step (h2) is performed using a chemical mechanical polishing method.

* * * * *